United States Patent
Lee

(10) Patent No.: US 12,033,934 B2
(45) Date of Patent: Jul. 9, 2024

(54) PACKAGE STRUCTURE, OPTICAL STRUCTURE AND METHOD FOR MANUFACTURING THE SAME

(71) Applicant: Advanced Semiconductor Engineering, Inc., Kaohsiung (TW)

(72) Inventor: Yu-Ying Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 149 days.

(21) Appl. No.: 17/710,647

(22) Filed: Mar. 31, 2022

(65) Prior Publication Data

US 2023/0317589 A1    Oct. 5, 2023

(51) Int. Cl.
 *H01L 23/498* (2006.01)
 *H01L 21/56* (2006.01)
 (Continued)

(52) U.S. Cl.
 CPC ........ *H01L 23/49838* (2013.01); *H01L 21/56* (2013.01); *H01L 23/3157* (2013.01); *H01L 23/49* (2013.01); *H01L 23/49811* (2013.01); *H01L 23/49827* (2013.01); *H01L 24/05* (2013.01); *H01L 24/32* (2013.01);
 (Continued)

(58) Field of Classification Search
 CPC . H01L 21/56; H01L 21/561; H01L 23/49838; H01L 23/3157; H01L 23/49; H01L 23/49811; H01L 23/49827; H01L 23/13; H01L 23/5384; H01L 24/05; H01L 24/32; H01L 24/81; H01L 24/14; H01L 24/16; H01L 24/73; H01L 24/48; H01L 25/167; H01L 25/105; H01L 2224/02379; H01L 2224/05166; H01L 2224/05647; H01L 2224/13083; H01L 2224/13111; H01L 2224/13139; H01L 2224/13147; H01L 2224/13155; H01L 2224/14177; H01L 2224/16145; H01L 2224/32145; H01L 2224/73204; H01L 2224/81801; H01L 2924/014

See application file for complete search history.

(56) References Cited

U.S. PATENT DOCUMENTS 9,978,654 B2 * 5/2018 Lin ..................... H01L 25/105
2018/0051590 A1   2/2018 Tableau et al.
(Continued)

OTHER PUBLICATIONS

U.S. Appl. No. 17/088,449, filed Nov. 3, 2020, Huang et al.

*Primary Examiner* — Marcos D. Pizarro
*Assistant Examiner* — Tiberiu Dan Onuta
(74) *Attorney, Agent, or Firm* — FOLEY & LARDNER LLP

(57) ABSTRACT

A package structure includes a first die, a second die, an encapsulant and at least one electrical contact. The first die has an active surface. The second die is disposed on the first die, and has an active surface and a backside surface opposite to the active surface. The active surface of the second die is closer to the active surface of the first die than the backside surface of the second die is. The encapsulant encapsulates the first die and the second die, and has a top surface far away from the active surface of the first die. The electrical contact is exposed from the top surface of the encapsulant and is configured for connecting at least one conductive wire.

20 Claims, 24 Drawing Sheets

(51) Int. Cl.
*H01L 23/00* (2006.01)
*H01L 23/31* (2006.01)
*H01L 23/49* (2006.01)
*H01L 25/16* (2023.01)

(52) U.S. Cl.
CPC ............ H01L 24/81 (2013.01); H01L 25/167 (2013.01); *H01L 24/14* (2013.01); *H01L 24/16* (2013.01); *H01L 24/73* (2013.01); *H01L 2224/02379* (2013.01); *H01L 2224/05166* (2013.01); *H01L 2224/05647* (2013.01); *H01L 2224/13083* (2013.01); *H01L 2224/13111* (2013.01); *H01L 2224/13139* (2013.01); *H01L 2224/13147* (2013.01); *H01L 2224/13155* (2013.01); *H01L 2224/14177* (2013.01); *H01L 2224/16145* (2013.01); *H01L 2224/32145* (2013.01); *H01L 2224/73204* (2013.01); *H01L 2224/81801* (2013.01); *H01L 2924/014* (2013.01)

(56) References Cited

U.S. PATENT DOCUMENTS

2021/0028134 A1   1/2021  Gerber
2021/0320042 A1*  10/2021 Oh ........................ H01L 25/105

* cited by examiner

PACKAGE STRUCTURE, OPTICAL STRUCTURE AND METHOD FOR MANUFACTURING THE SAME

BACKGROUND

1. Field of the Disclosure

The present disclosure relates to a package structure, an optical structure and a method for manufacturing the same.

2. Description of the Related Art

In a semiconductor package structure, an optical device may be electrically connected to a substrate and then encapsulated by an encapsulant. An external electrical path may extend downward and pass through a bottom surface of the substrate by disposing a plurality of solder balls on the bottom surface of the substrate. In some circumstance, such downward electrical path can not be formed. Thus, the external electrical path may need to extend upward and pass through a top surface of the encapsulant. However, such upward electrical path may be achieved by a stacked device or a flip chip bonding. It is difficult to form upward electrical path by wire bonding.

SUMMARY

In some embodiments, a package structure includes a first die, a second die, an encapsulant and at least one electrical contact. The first die has an active surface. The second die is disposed on the first die, and has an active surface and a backside surface opposite to the active surface. The active surface of the second die is closer to the active surface of the first die than the backside surface of the second die is. The encapsulant encapsulates the first die and the second die, and has a top surface far away from the active surface of the first die. The electrical contact is exposed from the top surface of the encapsulant and is configured for connecting at least one conductive wire.

In some embodiments, an optical structure includes a substrate, an optical component, at least one conductive structure and an encapsulant. The optical component is electrically connected to a top surface of the substrate. The conductive structure is disposed around the optical component and electrically connected to the optical component through the substrate. The encapsulant encapsulates the optical component, the at least one conductive structure and the top surface of the substrate. The conductive structure has at least one wire bonding contact exposed from the encapsulant.

In some embodiments, a method for manufacturing an optical structure includes: (a) electrically connecting an optical component to a substrate; (b) electrically connecting at least one conductive structure to the substrate; (c) forming a light transmitting material to encapsulate the optical component and the at least one conductive structure; and (d) thinning the light transmitting material, and exposing at least one bonding pad of the at least one conductive structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
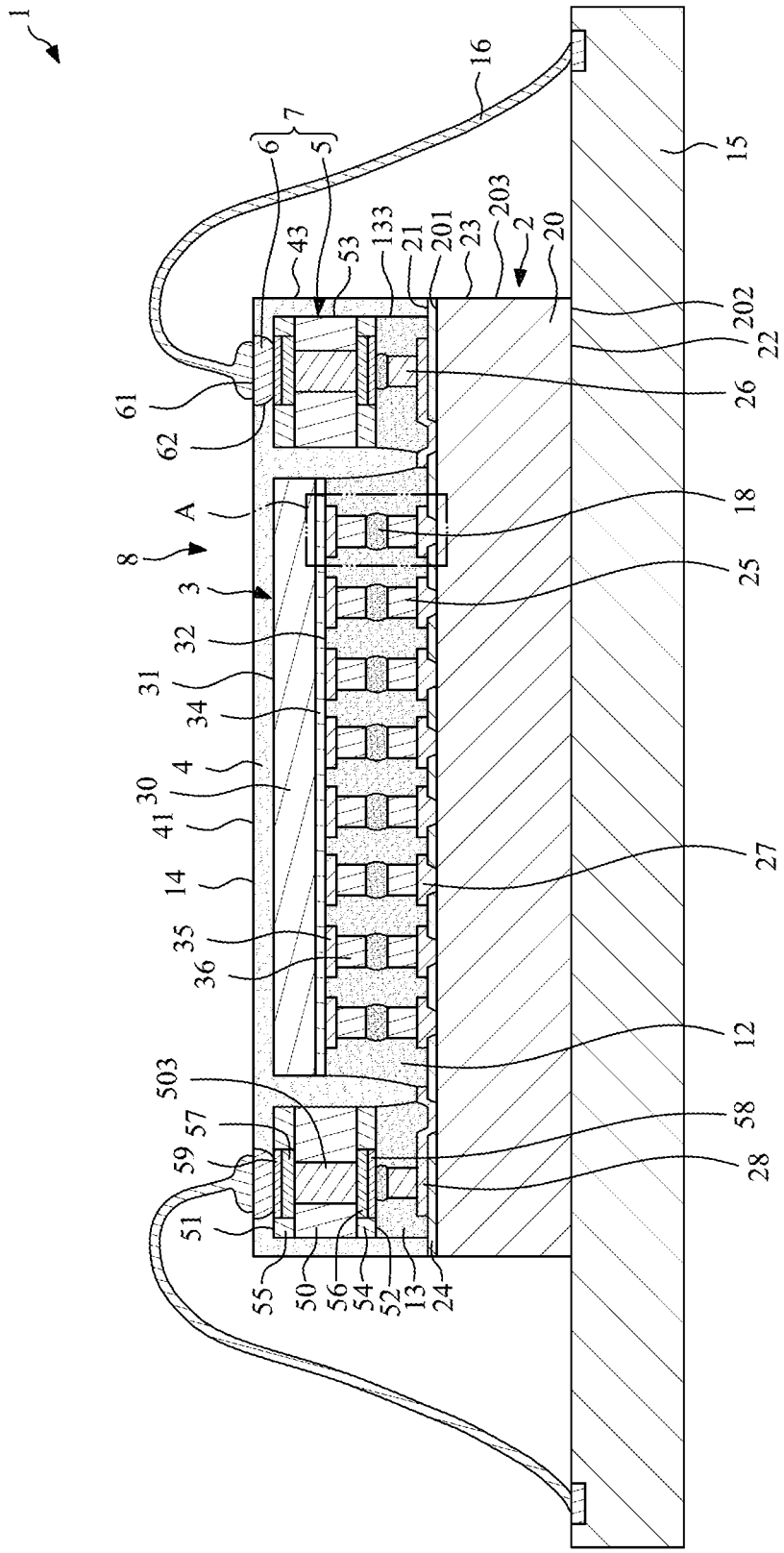
FIG. 1 illustrates a cross-sectional view of an optical structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an optical structure 1 according to some embodiments of the present disclosure. The optical structure 1 may be an assembly of a package structure 8, at least one conductive wire 16 and a carrier 15. The package structure 8 may be an optical package structure, an electronic package structure or a semiconductor package structure. The carrier 15 may be a substrate (e.g., a mother board such as a printed circuit board (PCB)).

The package structure 8 may include a substrate 2, an optical component 3, at least one conductive structure 7, a first underfill 12, a second underfill 13 and an encapsulant 4. The substrate 2 may be a semiconductor die such as a complementary metal oxide semiconductor (CMOS) die that may include optical device(s), optoelectronic device(s), and electronic device(s). In some embodiments, the substrate 2 may be also referred to as "a first die" or "a second die". The substrate 2 may have a top surface 21, a bottom surface 22 opposite to the top surface 21, and a lateral surface 23 extending between the top surface 21 and the bottom surface 22. The substrate 2 may include a base material 20, an upper dielectric layer 24, an upper circuit layer 28, a plurality of bump pads 27, a plurality of first pillars 25 and a plurality of second pillars 26. The base material 20 may include semiconductor material and CMOS device(s). The base material 20 may have a top surface 201, a bottom surface 202 opposite to the top surface 201, and a lateral surface 203 extending between the top surface 201 and the bottom surface 202. The top surface 201 may be an active surface, and the bottom surface 202 (i.e., the bottom surface 22 of the substrate 2) may be a backside surface. The upper dielectric layer 24 may be disposed on the top surface 201 of the base material 20, and may define a plurality of openings. The upper circuit layer 28 may be disposed on the upper dielectric layer 24, and may be electrically connected to the top surface 201 of the base material 20 through a plurality of vias in the openings of the upper dielectric layer 24. The upper circuit layer 28 may be disposed on the active surface 201 of the substrate 2 and exposed from the optical component 3 in a top view. The bump pads 27 may be disposed on the upper dielectric layer 24, and may be electrically connected to the top surface 201 of the base material 20 through a plurality of vias in the openings of the upper dielectric layer 24. In some embodiments, the upper circuit layer 28 may be a redistribution layer (RDL) or a fan-out circuit layer. In some embodiments, the upper circuit layer 28 and the bump pads 27 may be at the same layer. Alternatively, the bump pads 27 may be portions of the upper circuit layer 28. In some embodiments, the upper circuit layer 28 may be disposed around the bump pads 27. The truncated top surface 61 of the bonding pad 6 (e.g., the electrical contact) may be electrically connected to the substrate 2 through the upper circuit layer 28.

As shown in FIG. 1, the top surface 21 of the substrate 2 may be the top surface of the upper dielectric layer 24 or the top surface of the upper circuit layer 28. The bottom surface 22 of the substrate 2 may be the bottom surface 202 of the base material 20. The lateral surface 23 of the substrate 2 may include the lateral surface 203 of the base material 20 and the lateral surface of the upper dielectric layer 24. The first pillars 25 may be disposed on the bump pads 27, and the second pillars 26 may be disposed on the upper circuit layer 28. In some embodiments, the first pillars 25 and the second pillars 26 may be formed concurrently at a same manufacturing stage. The size (e.g., height or width) of the first pillar 25 may be equal to the size (e.g., height or width) of the second pillar 26.

The optical component 3 may be a semiconductor die that may include optical device(s), optoelectronic device(s) and electronic device(s). In some embodiments, the optical component 3 may be also referred to as "a first die" or "a second die" The optical component 3 may be electrically connected to the substrate 2 through a plurality of soldering materials 18. That is, the optical component 3 is electrically connected to the top surface 21 of the substrate 2 through flip-chip bonding. The optical component 3 may have a top surface 31 and a bottom surface 32 opposite to the top surface 31. The bottom surface 32 may be an active surface, and the top surface 31 may be a backside surface. The bottom surface 32 (e.g., active surface) of the optical component 3 is closer to the active surface 201 of the substrate 2 than the top surface 31 (e.g., backside surface) of the optical component 3 is.

The optical component 3 may include a main body 30, an outer layer 34, a plurality of bump pads 35 and a plurality of pillars 36. The main body 30 may be transparent. The outer layer 34 may be disposed on a bottom surface of the main body 30. Thus, the outer layer 34 may be disposed adjacent to the bottom surface 32 (e.g., the active surface) of the optical component 3. The bottom surface of the outer layer 34 may be the bottom surface 32 of the optical component 3. In some embodiments, the outer layer 34 may be a sensor region, sensor layer or a dielectric layer. The bump pads 35 may be disposed on the outer layer 34, and may be electrically connected to the outer layer 34 or the bottom surface of the main body 30. The pillars 36 may be disposed on the bump pads 35. The pillars 36 of the optical component 3 may be physically connected and electrically connected to the first pillars 25 of the substrate 2 through the soldering materials 18. In some embodiments, the main body 30 may be omitted.

The first underfill 12 is disposed in a space between the top surface 21 of the substrate 2 and the bottom surface 32 of the optical component 3, so as to cover and protect the bump pads 27, the first pillars 25, the soldering materials 18, the pillars 36 and the bump pads 35. In some embodiments, the first underfill 12 may include a thermal compression non-conductive paste (TCNCP).

The conductive structure(s) 7 may be disposed around the optical component 3, and electrically connected to the top surface 21 of the substrate 2. The conductive structure 7 is electrically connected to the optical component 3 through the substrate 2. The conductive structure 7 may form a vertically electrical path, and may include at least one interposer 5 and at least one bonding pad 6. The interposer 5 may be also referred to as "a substrate", and is disposed between a truncated top surface 61 of the bonding pad 6 (e.g., an electrical contact) and the substrate 2.

The interposer 5 may have a top surface 51, a bottom surface 52 opposite to the top surface 51, and a lateral surface 53 extending between the top surface 51 and the bottom surface 52. The interposer 5 may include a core portion 50, an upper dielectric layer 55, an upper conductive layer 57, an upper surface finish layer 59, a lower dielectric layer 54, a lower conductive layer 56 and a lower surface finish layer 58. The core portion 50 may include BT (Bismaleimide Triazine), FR4, FR5, PI and epoxy resin. The core portion 50 may include a through via 503 extending through the core portion 50 and electrically connecting the upper conductive layer 57 and the lower conductive layer 56. The upper dielectric layer 55 and the upper conductive layer 57 may be disposed on a top surface of the core portion 50. In some embodiments, the upper conductive layer 57 may be a patterned circuit layer such as a redistribution layer (RDL) or a fan-out circuit layer. The upper conductive layer 57 may include a trace and a pad. The upper dielectric layer 55 may define at least one opening to expose the pad of the upper conductive layer 57. The upper surface finish layer 59 may be disposed on the exposed pad of the upper conductive layer 57.

The lower dielectric layer 54 and the lower conductive layer 56 may be disposed on a bottom surface of the core portion 50. In some embodiments, the lower conductive layer 56 may be a patterned circuit layer such as a redistribution layer (RDL) or a fan-out circuit layer. The lower conductive layer 56 may include a trace and a pad. The lower dielectric layer 54 may define at least one opening to expose the pad of the lower conductive layer 56. The lower surface finish layer 58 may be disposed on the exposed pad of the lower conductive layer 56. The lower conductive layer 56 with the lower surface finish layer 58 may be physically connected and electrically connected to the second pillars 26 of the substrate 2 through the soldering materials 18. Thus, the interposer 5 is electrically connected to the substrate 2 through the second pillars 26. Thus, the vertically electrical path (e.g., the conductive structure 7) may further include the second pillar 26. In some embodiments, the upper surface finish layer 59 and the lower surface finish layer 58 may be omitted.

The second underfill 13 is disposed in a space between the top surface 21 of the substrate 2 and the bottom surface 52 of the interposer 5, so as to cover and protect the upper circuit layer 28 of the substrate 2, the second pillars 26 and the soldering materials 18. Thus, the second underfill 13 encapsulate the second pillars 26. In some embodiments, the second underfill 13 may have a lateral surface 133. The lateral surface 133 of the second underfill 13 may be substantially aligned or coplanar with the lateral surface 53 of the interposer 5.

The bonding pad 6 may be a bump, and may be disposed on and electrically connected to the top surface 51 of the interposer 5. For example, the bonding pad 6 may be physically and electrically connected to the upper surface finish layer 59 on the pad of the upper conductive layer 57. The bonding pad 6 may be formed from a stud bump. The bonding pad 6 may have a truncated top surface 61 and a curved lateral surface 62. A width of the bonding pad 6 may taper toward the interposer 5. The bonding pad 6 may be an electrical contact. The truncated top surface 61 of the bonding pad 6 may be an electrical contact, a wire bonding area or a wire bonding contact that is configured for connecting a conductive wire 16. Alternatively, the truncated top surface 61 of the bonding pad 6 may include an electrical contact, a wire bonding area or a wire bonding contact. As shown in FIG. 1, the vertically electrical path (e.g., the conductive structure 7) is right under the bonding pad 6, and is configured for electrically connecting the bonding pad 6 to the substrate 2. Thus, the bonding pad 6 may be electrically connected to the bottom surface 32 (e.g., active surface) of the optical component 3 through the vertically electrical path (e.g., the conductive structure 7 including, for example, the bonding pad 6, the interposer 5 and the second pillar 26) and the substrate 2. As shown in FIG. 1, the truncated top surface 61 of the bonding pad 6 (e.g., the electrical contact) is spaced apart from the optical component 3 and is electrically connected to the substrate 2. The conductive structure 7 may have a wire bonding contact (e.g., the truncated top surface 61 of the bonding pad 6) exposed from the encapsulant 4.

The encapsulant 4 is disposed on the top surface 21 of the substrate 2 to encapsulate the optical component 3, the first underfill 12, the conductive structure 7 (including the bonding pad 6 and the interposer 5), the second underfill 13 and the top surface 21 of the substrate 2. The encapsulant 4 covers the outer layer 34 (e.g., the sensor region) of the optical component 3, and includes a light transmitting material. The encapsulant 4 may have a top surface 41 and a lateral surface 43. The top surface 14 may be far away from the active surface 201 of the substrate 2. A first portion of the encapsulant 4 may cover and contact the top surface 31 of the optical component 3 and the top surface 51 of the interposer 5. Thus, an elevation of the top surface 31 (e.g., active surface) of the optical component 3 and the top surface 51 of the interposer 5 may be lower than an elevation of the top surface 41 of the encapsulant 4. In addition, the top surface 41 of the encapsulant 4 may be substantially aligned or coplanar with the truncated top surface 61 of the bonding pad 6 (or the wire bonding area), since they are ground concurrently. A second portion of the encapsulant 4 may cover and contact the lateral surface 133 of the second underfill 13 and the lateral surface 53 of the interposer 5 (e.g., a lateral surface of the conductive structure 7). Thus, the lateral surface 43 of the encapsulant 4 may be distant from the lateral surface 133 of the second underfill 13 and the lateral surface 53 of the interposer 5. The lateral surface 43 of the encapsulant 4 may be aligned with the lateral surface 23 of the substrate 2.

In some embodiments, the package structure 8 may have a top surface 14. The top surface 14 of the package structure 8 may be a light entrance surface. That is, a light beam may pass through the top surface 14 of the package structure 8. Thus, the bonding pad 6 is disposed adjacent to and exposed from the light entrance surface 14 of the package structure 8. The encapsulant 4 may be transparent, and a reflective index of the encapsulant 4 may be approximate to or substantially equal to a reflective index of the main body 30 of the optical component 3. As shown in FIG. 1, the light entrance surface 14 is a top surface 41 of the first portion of the encapsulant 4 above the optical component 3.

The carrier 15 is used for receiving the bottom surface 22 of the substrate 2 of the package structure 8. The carrier 15 is disposed under the bottom surface 22 (e.g., backside surface) of the substrate 2. In some embodiments, the bottom surface 22 of the substrate 2 may be adhered to the carrier 15. The conductive wire 16 physically connects and electrically connects the bonding pad 6 (e.g., electrical contact) and the carrier 15. Thus, an electrical path may be formed between the substrate 2 and the carrier 15 by a sequence of the second pillars 26, the interposer 5, the bonding pad 6 and the conductive wire 16. In other words, the electrical path may not pass through the substrate 2 directly. For example, if the substrate 2 is a semiconductor die that is electrically to the optical component 3 face to face, in order to maintain the sensing function of the sensor region (e.g., the outer layer 34) of the optical component 3, the interposer 5 can transmit the signals of the substrate 2 to an external connection efficiently. A portion of the conductive wire 16 may extend along the lateral side of the substrate 2 that is near the lateral surface 23 of the substrate 2. In some embodiments, a material of the bonding pad 6 is same as a material of the conductive wire 16 so as to improve the bonding quality or joint quality between the bonding pad 6 and the conductive wire 16.

Figure 1A:
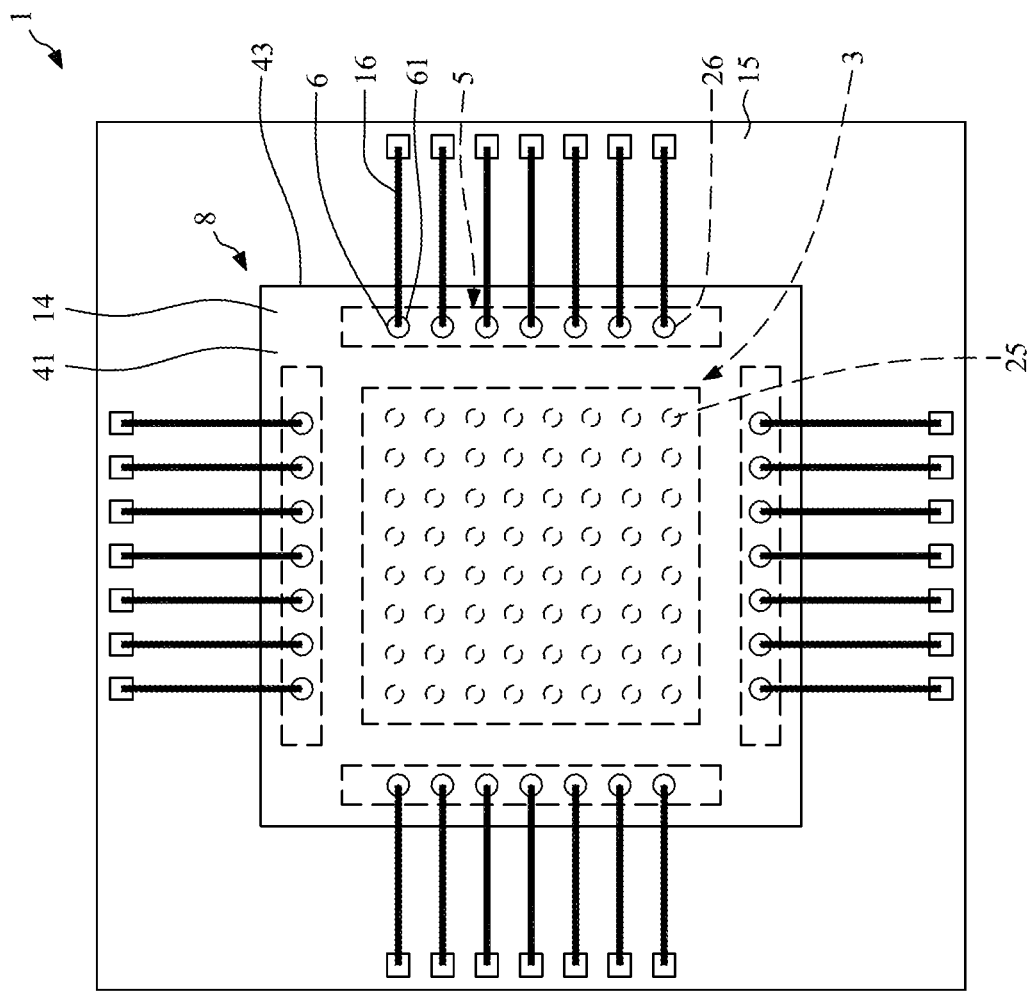
FIG. 1A illustrates a top view of the optical structure of FIG. 1.

FIG. 1A illustrates a top view of the optical structure 1 of FIG. 1. As show in FIG. 1A, the conductive structure 7 may include a plurality of the bonding pads 6 disposed on one interposer 5. The bonding pads 6 may be disposed around the optical component 3. A length of the interposer 5 may be greater than a width of the optical component 3. In addition, the package structure 8 may include a plurality of conductive structures 7 disposed around the optical component 3.

Figure 1B:
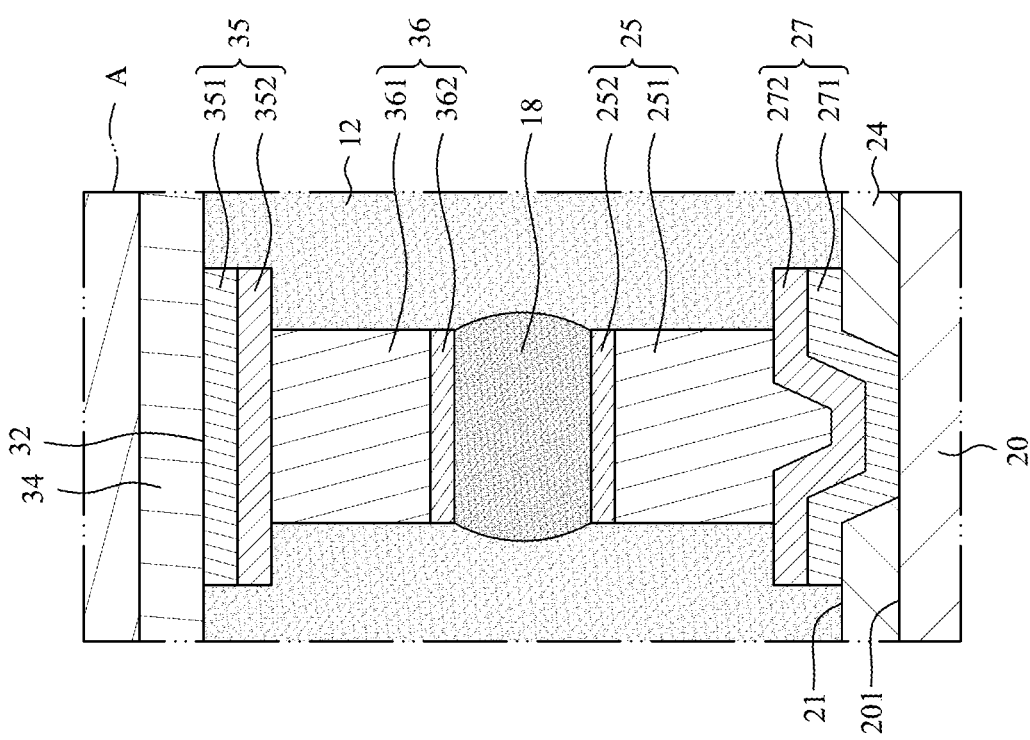
FIG. 1B illustrates an enlarged view of an area "A" of FIG. 1.

FIG. 1B illustrates an enlarged view of an area "A" of FIG. 1. The bump pad 27 may include a seed layer 271 disposed on the upper dielectric layer 24 and a conductive layer 272 disposed on the seed layer 271. The seed layer 271 may include titanium (Ti), and the conductive layer 272 may include copper (Cu). The first pillar 25 may include a base material 251 disposed on the bump pad 27 and a barrier layer 252 disposed on the base material 251. The base material 251 may include copper (Cu), and the barrier layer 252 may include nickel (Ni). The bump pad 35 may include a seed layer 351 disposed on the outer layer 34 and a conductive layer 352 disposed on the seed layer 351. The seed layer 351 may include titanium (Ti), and the conductive layer 352 may include copper (Cu). The pillar 36 may include a base material 361 disposed on the bump pad 35 and a barrier layer 362 disposed on the base material 361. The base material 361 may include copper (Cu), and the barrier layer 362 may include nickel (Ni). In addition, the soldering material 18 may include tin (Sn) and silver (Ag).

Figure 2:
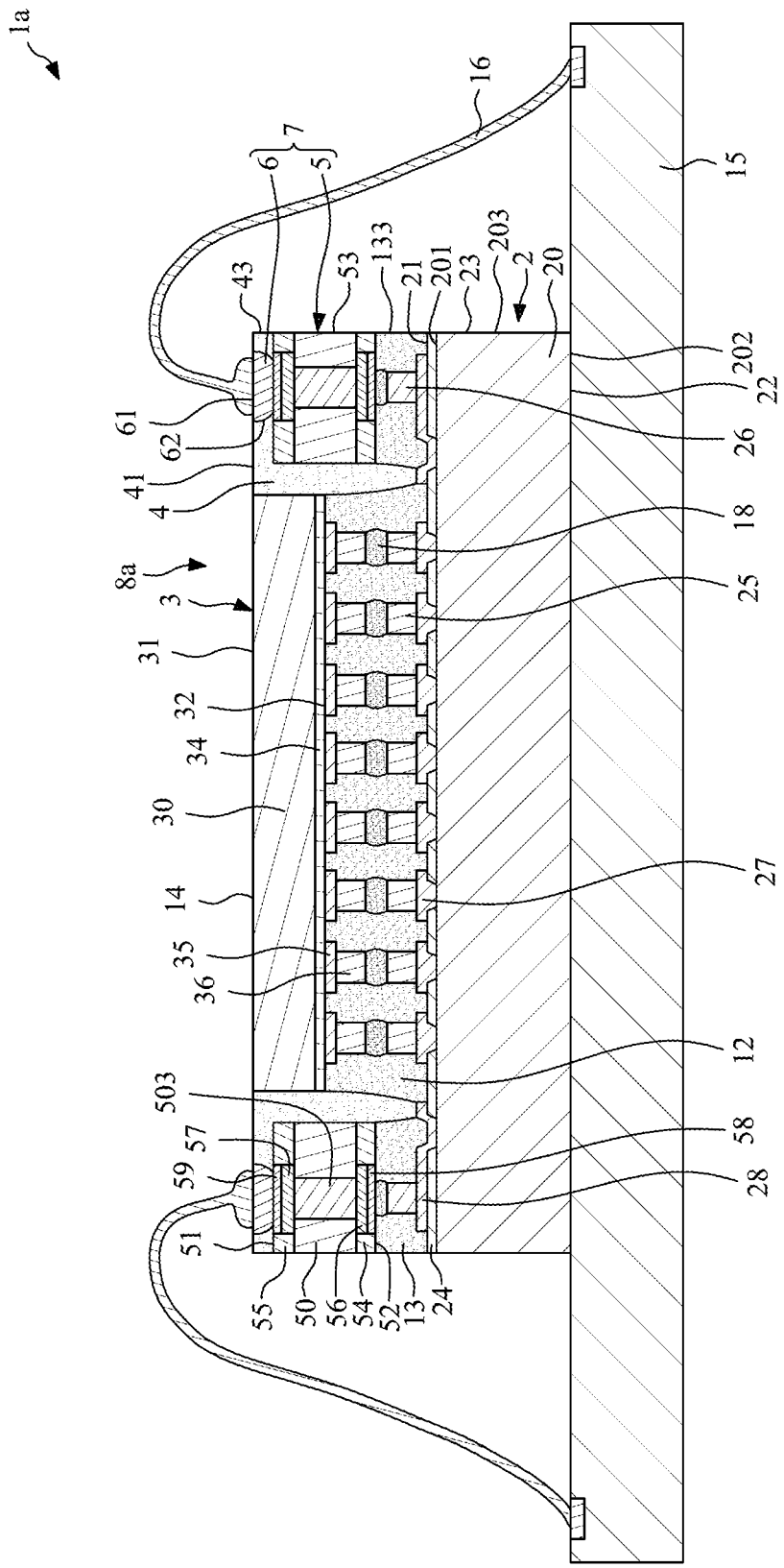
FIG. 2 illustrates a cross-sectional view of an optical structure according to some embodiments of the present disclosure.

FIG. 2 illustrates a cross-sectional view of an optical structure 1a according to some embodiments of the present disclosure. The optical structure 1a is similar to the optical structure 1 shown in FIG. 1, except for a structure of the package structure 8a. As shown in the package structure 8a of FIG. 2, the lateral surface 43 of the encapsulant 4 may be substantially aligned or coplanar with the lateral surface 53 of the interposer 5, the lateral surface 133 of the second underfill 13 and the lateral surface 23 of the substrate 2 since they are formed concurrently at a singulation stage.

In addition, the top surface 31 of the optical component 3 may be substantially aligned or coplanar with the top surface 41 of the encapsulant 4 and the truncated top surface 61 of the bonding pad 6. Thus, the top surface 31 of the optical component 3 may be exposed from the encapsulant 4, and the top surface 31 of the optical component 3 may be the top surface 14 (e.g., light entrance surface) of the package structure 8.

Figure 3:
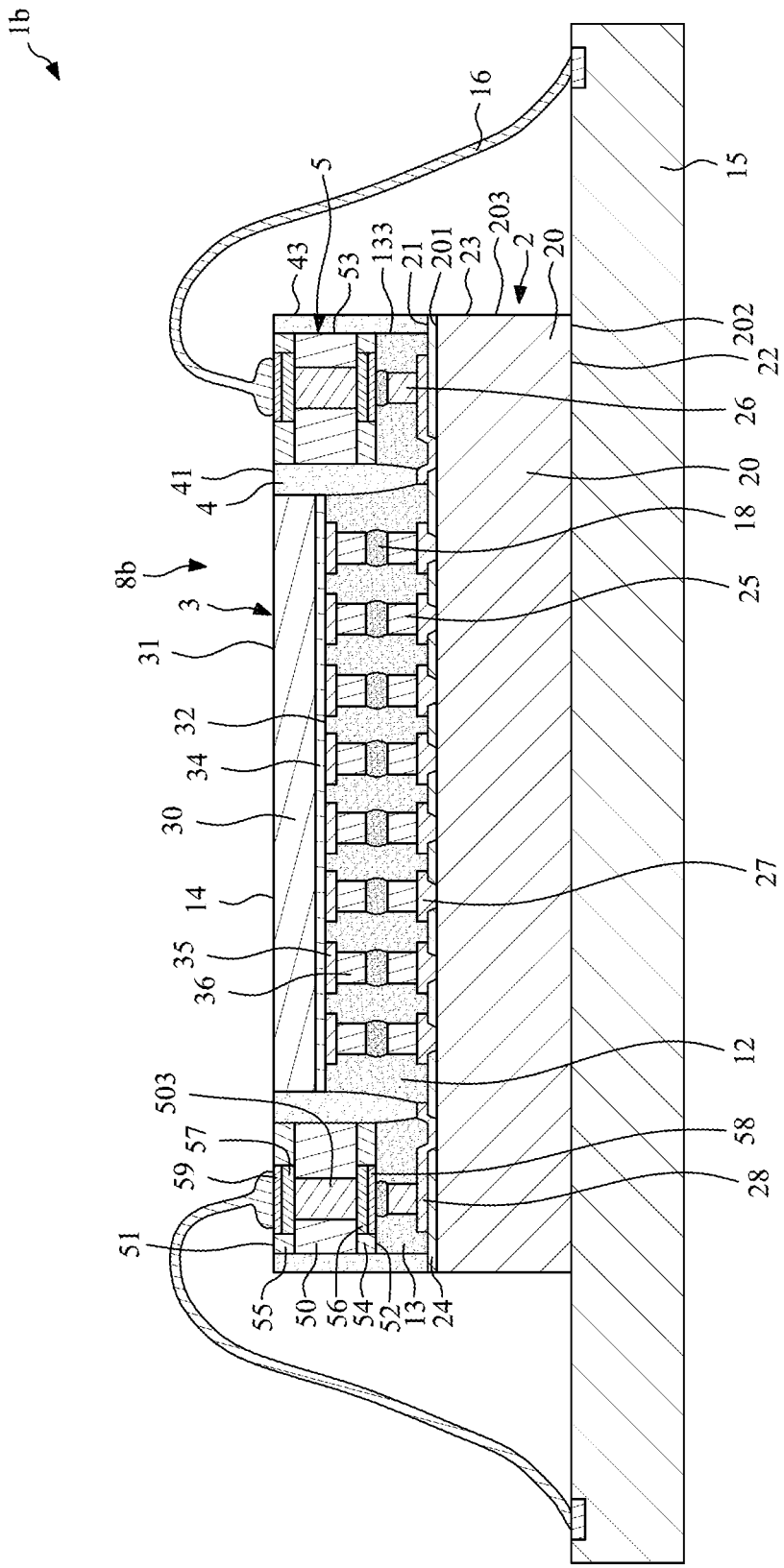
FIG. 3 illustrates a cross-sectional view of an optical structure according to some embodiments of the present disclosure.

FIG. 3 illustrates a cross-sectional view of an optical structure 1b according to some embodiments of the present disclosure. The optical structure 1b is similar to the optical structure 1 shown in FIG. 1, except for a structure of the package structure 8b. As shown in the package structure 8b of FIG. 3, a portion of the encapsulant 4 and the bonding pad 6 of FIG. 1 may be removed or omitted. Thus, the top surface 31 of the optical component 3 may be substantially aligned or coplanar with the top surface 41 of the encapsulant 4 and the top surface 51 of the interposer 5. Thus, the pad of the upper conductive layer 57 or the upper surface finish layer 59 on the pad of the upper conductive layer 57 may be exposed from the encapsulant 4. The conductive wire 16 may be connected to and bonded to the exposed pad of the upper conductive layer 57 or the upper surface finish layer 59 on the exposed pad of the upper conductive layer 57. That is, the exposed pad of the upper conductive layer 57 or the upper surface finish layer 59 on the exposed pad of the upper conductive layer 57 may be used as a wire bonding pad or a wire bonding area.

Figure 4:
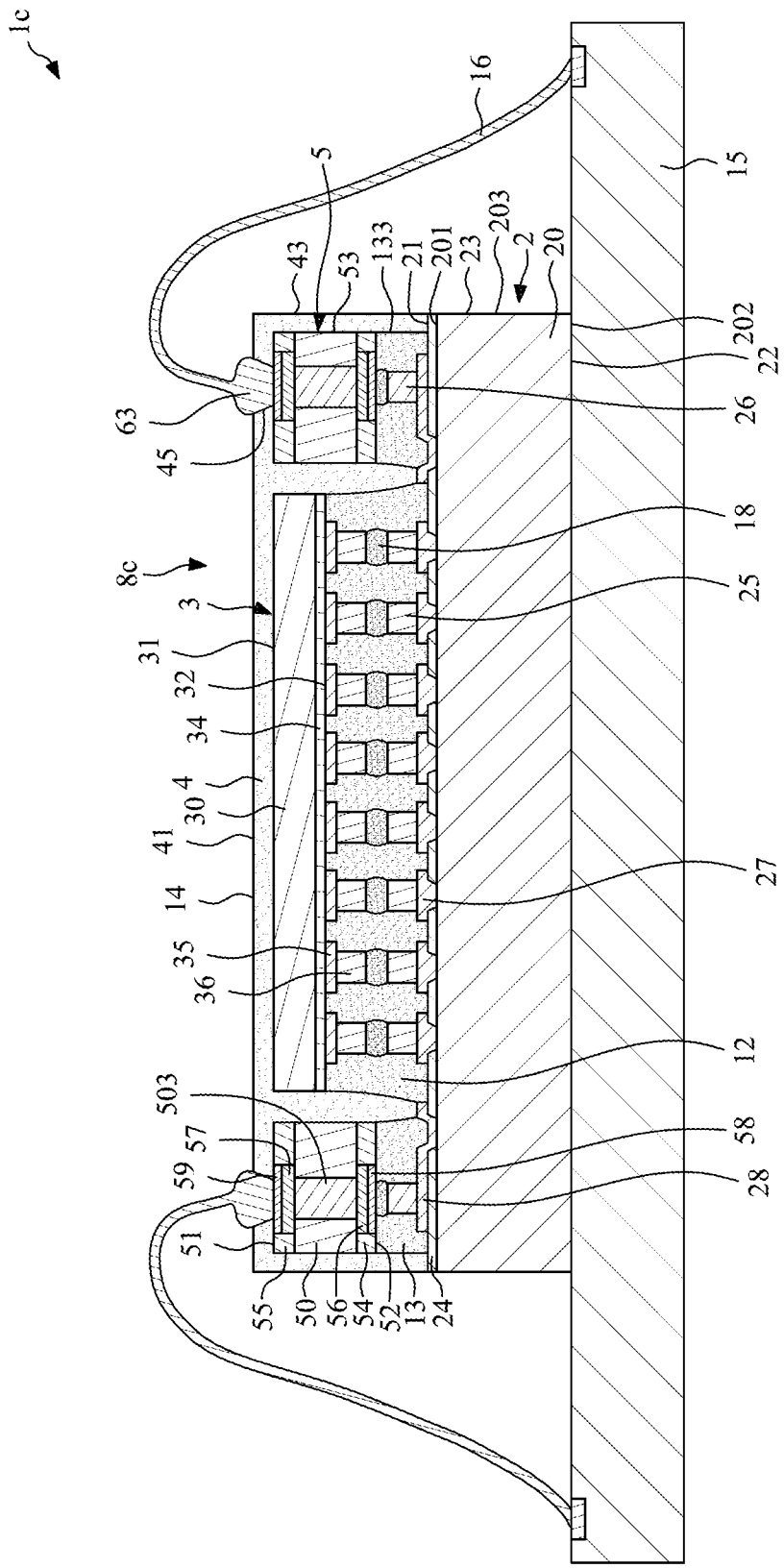
FIG. 4 illustrates a cross-sectional view of an optical structure according to some embodiments of the present disclosure.

FIG. 4 illustrates a cross-sectional view of an optical structure 1c according to some embodiments of the present disclosure. The optical structure 1c is similar to the optical structure 1 shown in FIG. 1, except for a structure of the package structure 8c. As shown in the package structure 8c of FIG. 4, the bonding pad 6 of FIG. 1 may be omitted. The encapsulant 4 defines at least one opening 45 to expose the pad of the upper conductive layer 57 or the upper surface finish layer 59 on the pad of the upper conductive layer 57. That is, the exposed pad of the upper conductive layer 57 or the upper surface finish layer 59 on the exposed pad of the upper conductive layer 57 may be used as a wire bonding pad or a wire bonding area. The conductive wire 16 may be connected to and bonded to the exposed pad of the upper conductive layer 57 or the upper surface finish layer 59 on the exposed pad of the upper conductive layer 57. An end portion of the conductive wire 16 may be disposed in the opening 45 of the encapsulant 4.

Figure 5:
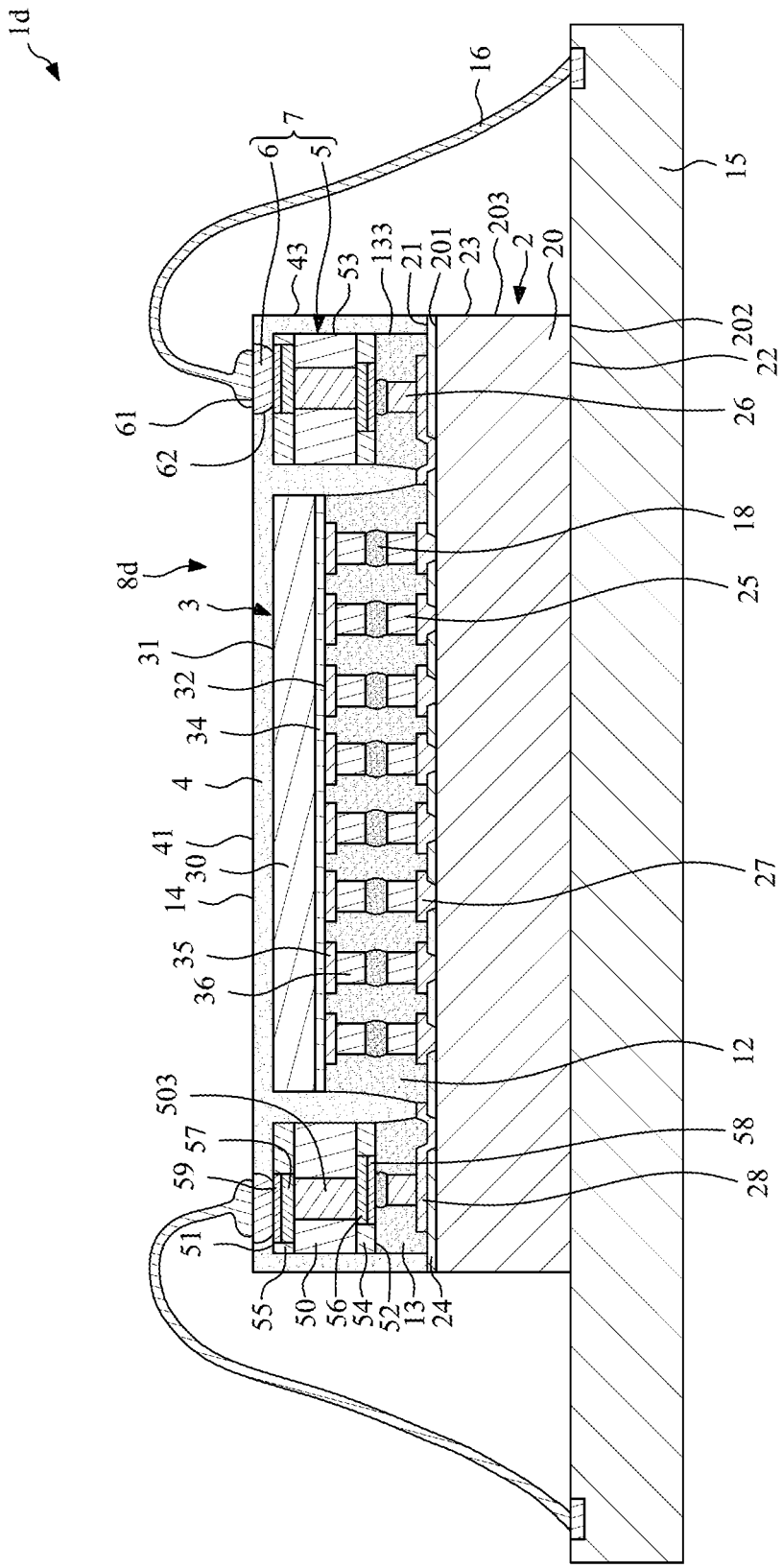
FIG. 5 illustrates a cross-sectional view of an optical structure according to some embodiments of the present disclosure.

FIG. 5 illustrates a cross-sectional view of an optical structure 1d according to some embodiments of the present disclosure. The optical structure 1d is similar to the optical structure 1 shown in FIG. 1, except for a structure of the package structure 8d. As shown in the package structure 8d of FIG. 5, both the lower conductive layer 56 and the upper conductive layer 57 may be redistribution layers (RDLs). Thus, the through via 503 of the interposer 5 may be misaligned with the second pillar 26.

FIG. 6 through FIG. 18 illustrate a method for manufacturing an optical structure according to some embodiments of the present disclosure. In some embodiments, the method is for manufacturing the optical structure 1 shown in FIG. 1.

Figure 6:
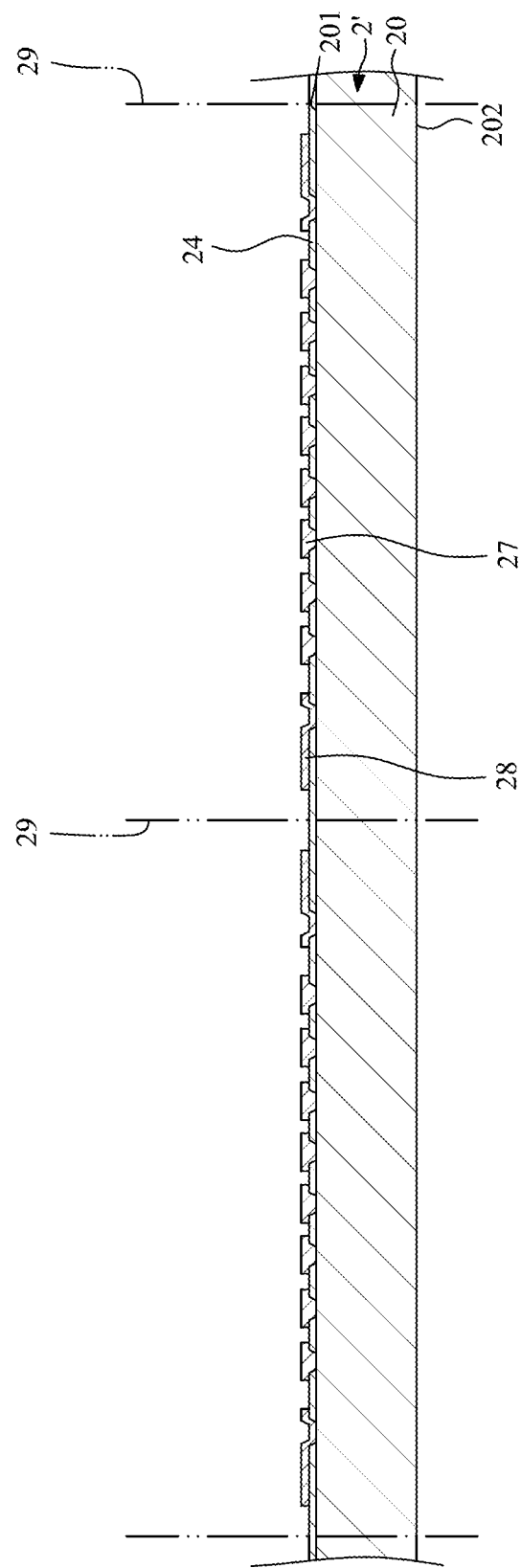
FIG. 6 illustrates one or more stages of an example of a method for manufacturing an optical structure according to some embodiments of the present disclosure.

Referring to FIG. 6, a substrate 2' is provided. In some embodiments, the substrate 2' of FIG. 6 may be similar to or same as the substrate 2 of FIG. 1. The substrate 2' may include a base material 20, an upper dielectric layer 24, an upper circuit layer 28 and a plurality of bump pads 27. The base material 20 may have a top surface 201 and a bottom surface 202 opposite to the top surface 201. The top surface 201 may be an active surface, and the bottom surface 202 may be a backside surface. The upper dielectric layer 24 may be disposed on the top surface 201 of the base material 20, and may define a plurality of openings. The upper circuit layer 28 may be disposed on the upper dielectric layer 24, and may be electrically connected to the top surface 201 of the base material 20 through a plurality of vias in the openings of the upper dielectric layer 24. The bump pads 27 may be disposed on the upper dielectric layer 24, and may be electrically connected to the top surface 201 of the base material 20 through a plurality of vias in the openings of the upper dielectric layer 24. In some embodiments, the upper circuit layer 28 may be a redistribution layer (RDL) or a fan-out circuit layer. In some embodiments, the upper circuit layer 28 and the bump pads 27 may be at the same layer. Alternatively, the bump pads 27 may be portions of the upper circuit layer 28. In some embodiments the upper circuit layer 28 may be disposed around the bump pads 27. The substrate 2' may have a plurality of cutting lines 29.

Figure 7:
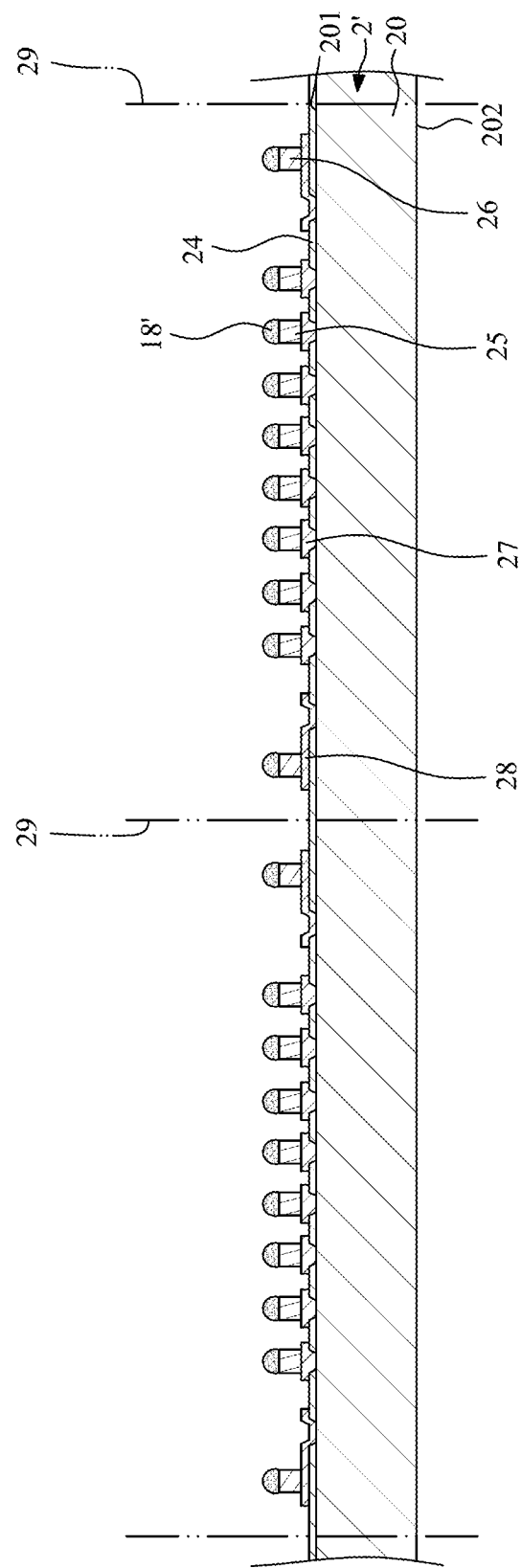
FIG. 7 illustrates one or more stages of an example of a method for manufacturing an optical structure according to some embodiments of the present disclosure.

Referring to FIG. 7, a plurality of first pillars 25 may be formed or disposed on the bump pads 27, and a plurality of second pillars 26 may be formed or disposed on the upper circuit layer 28. In some embodiments, the first pillars 25 and the second pillars 26 may be formed concurrently at a same manufacturing stage. Then, a plurality of soldering materials 18' are formed on the first pillars 25 and the second pillars 26.

Figure 8:
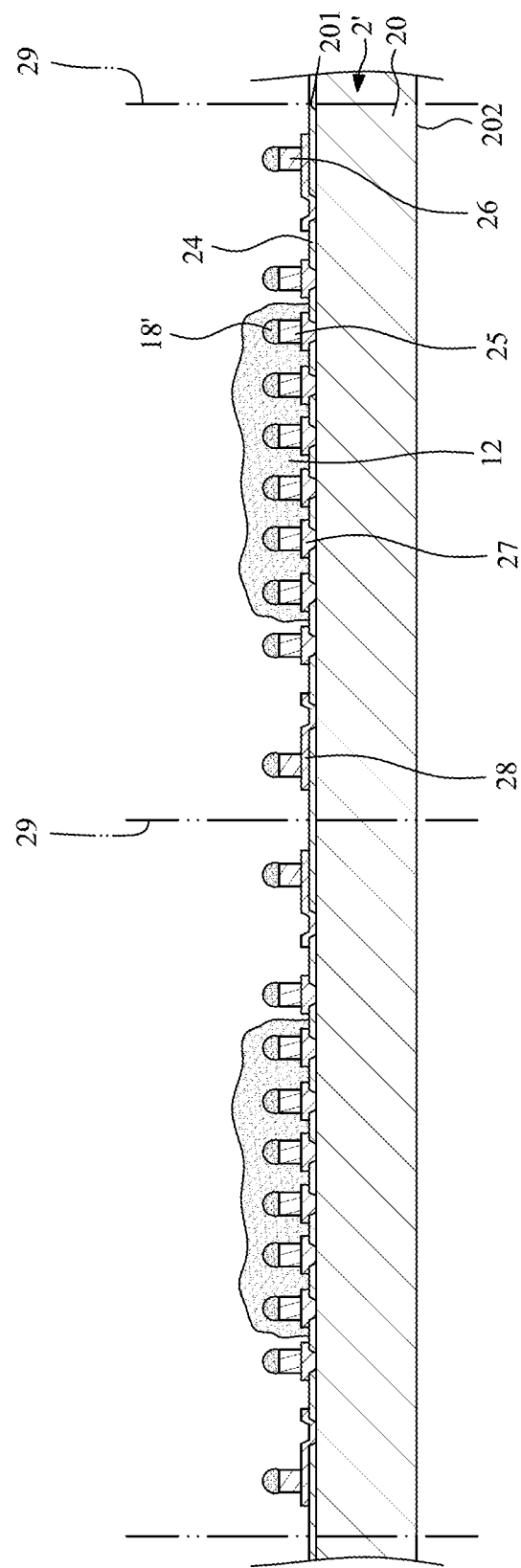
FIG. 8 illustrates one or more stages of an example of a method for manufacturing an optical structure according to some embodiments of the present disclosure.

Referring to FIG. 8, a first underfill 12 is formed or disposed on the upper dielectric layer 24 to cover the first pillars 25 and the soldering materials 18' on the first pillars 25. In some embodiments, the first underfill 12 may include a thermal compression non-conductive paste (TCNCP).

Figure 9:
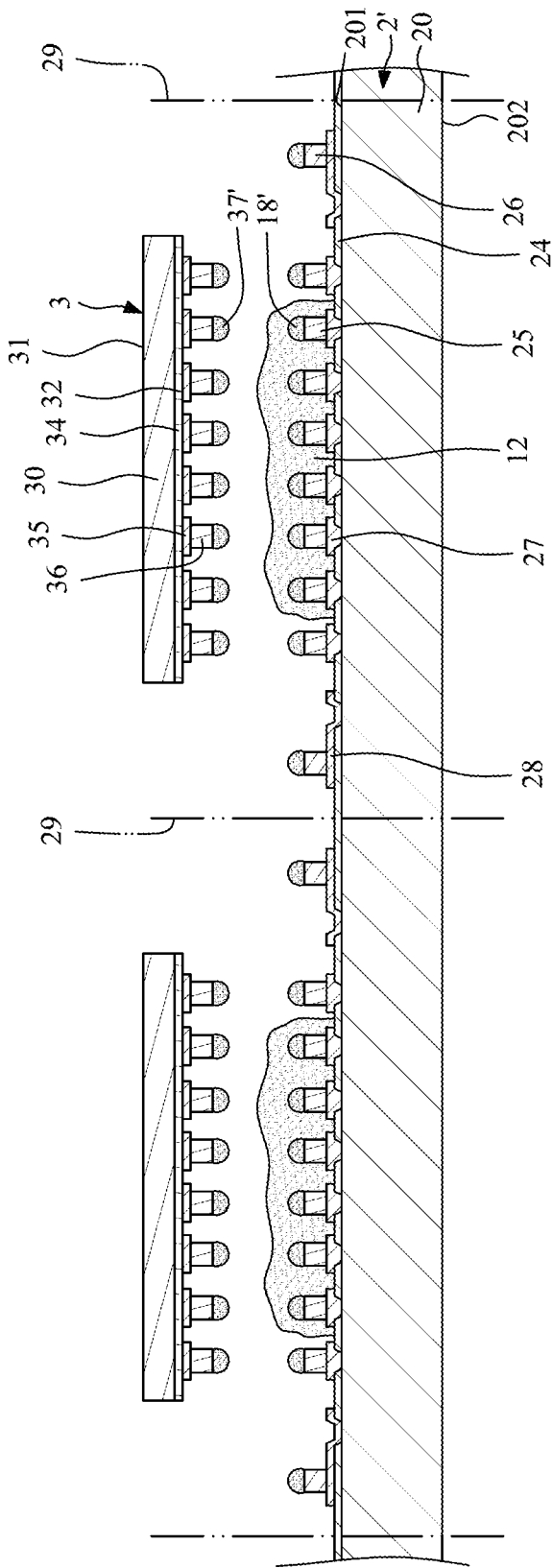
FIG. 9 illustrates one or more stages of an example of a method for manufacturing an optical structure according to some embodiments of the present disclosure.

Referring to FIG. 9, an optical component 3 is provided. The optical component 3 of FIG. 9 may be similar to or same as the optical component 3 of FIG. 1. The optical component 3 may have a top surface 31 and a bottom surface 32 opposite to the top surface 31. The optical component 3 may include a main body 30, an outer layer 34, a plurality of bump pads 35, a plurality of pillars 36 and a plurality of soldering materials 37'. The outer layer 34 may be disposed on a bottom surface of the main body 30. The bottom surface of the outer layer 34 may be the bottom surface 32 of the optical component 3. The bump pads 35 may be disposed on the outer layer 34, and may be electrically connected to the outer layer 34 or the bottom surface of the main body 30. The pillars 36 may be disposed on the bump pads 35. The soldering materials 37' may be disposed on the pillars 36.

Figure 10:
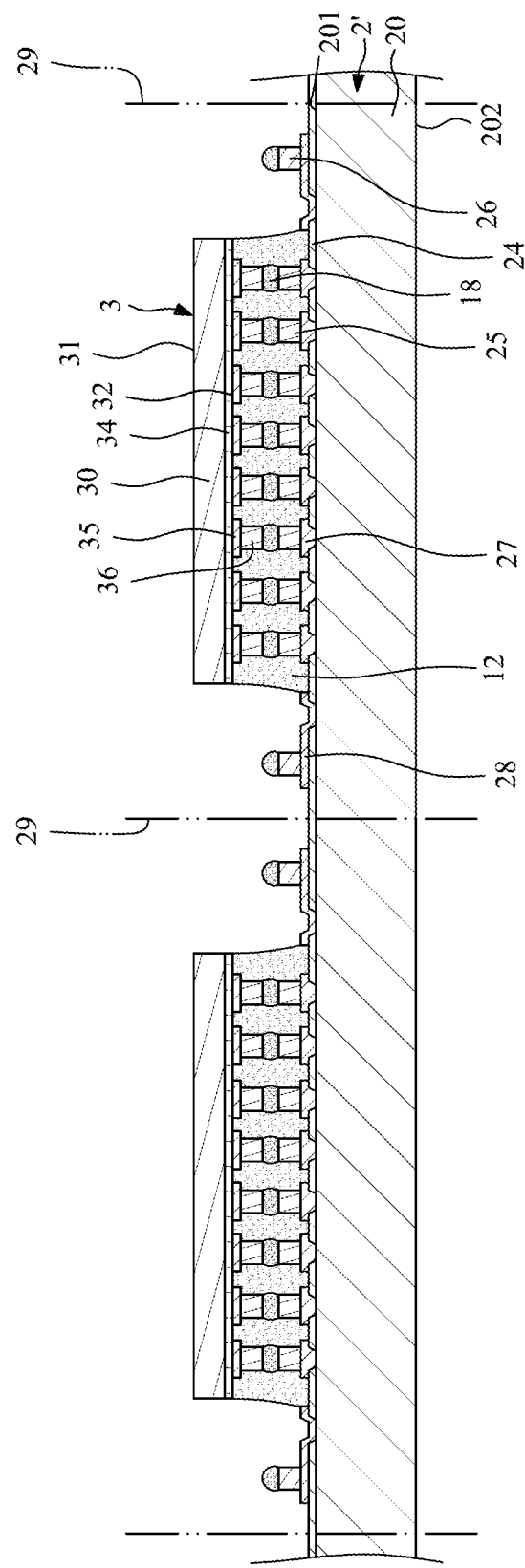
FIG. 10 illustrates one or more stages of an example of a method for manufacturing an optical structure according to some embodiments of the present disclosure.

Referring to FIG. 10, the optical component 3 may be physically connected to and electrically connected to the substrate 2' through flip-chip bonding. Thus, the soldering materials 37' on the pillars 36 and the soldering materials 18' on the first pillars 25 may be molten together to form the soldering material 18. Thus, the optical component 3 may be physically connected to and electrically connected to the substrate 2' through the soldering material 18.

Figure 11:
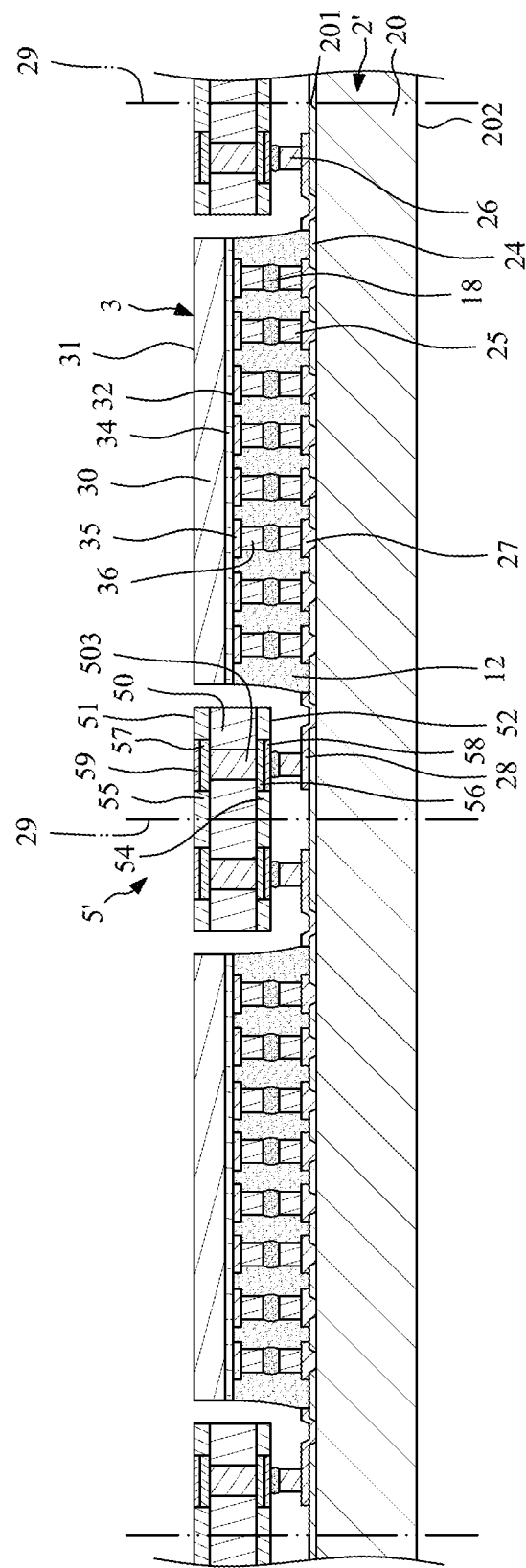
FIG. 11 illustrates one or more stages of an example of a method for manufacturing an optical structure according to some embodiments of the present disclosure.

Referring to FIG. 11 through FIG. 16, at least one conductive structure 7 is formed or disposed to electrically connect to the substrate 2'. Referring to FIG. 11, at least one interposer 5' is provided to electrically connect to the substrate 2'. The interposer 5' of FIG. 11 may be similar to or same as the interposer 5 of FIG. 1. The interposer 5' may have a top surface 51 and a bottom surface 52 opposite to the top surface 51. The interposer 5' may include a core portion 50, an upper dielectric layer 55, an upper conductive layer 57, an upper surface finish layer 59, a lower dielectric layer 54, a lower conductive layer 56 and a lower surface finish layer 58. Then, the interposer 5' is electrically connected to the substrate 2' through the soldering materials 18' on the second pillars 26.

Figure 12:
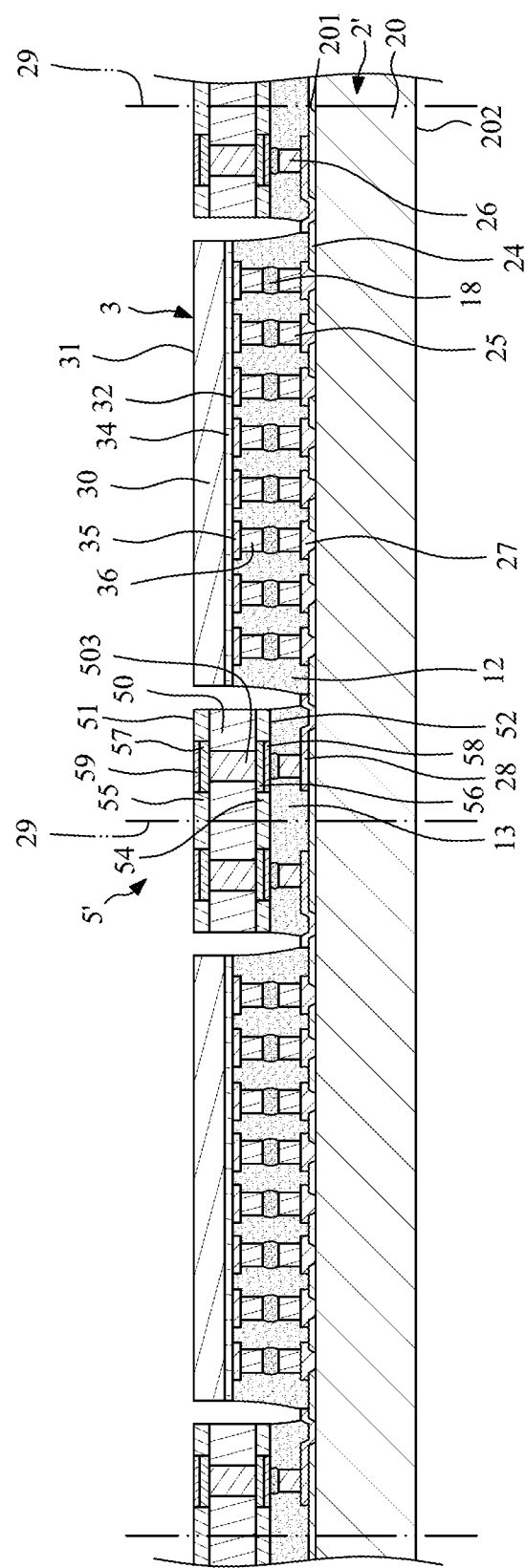
FIG. 12 illustrates one or more stages of an example of a method for manufacturing an optical structure according to some embodiments of the present disclosure.

Referring to FIG. 12, a second underfill 13 is formed or disposed in a space between the substrate 2' and the interposer 5', so as to cover and protect the upper circuit layer 28 of the substrate 2', the second pillars 26 and the soldering materials 18.

Figure 13:
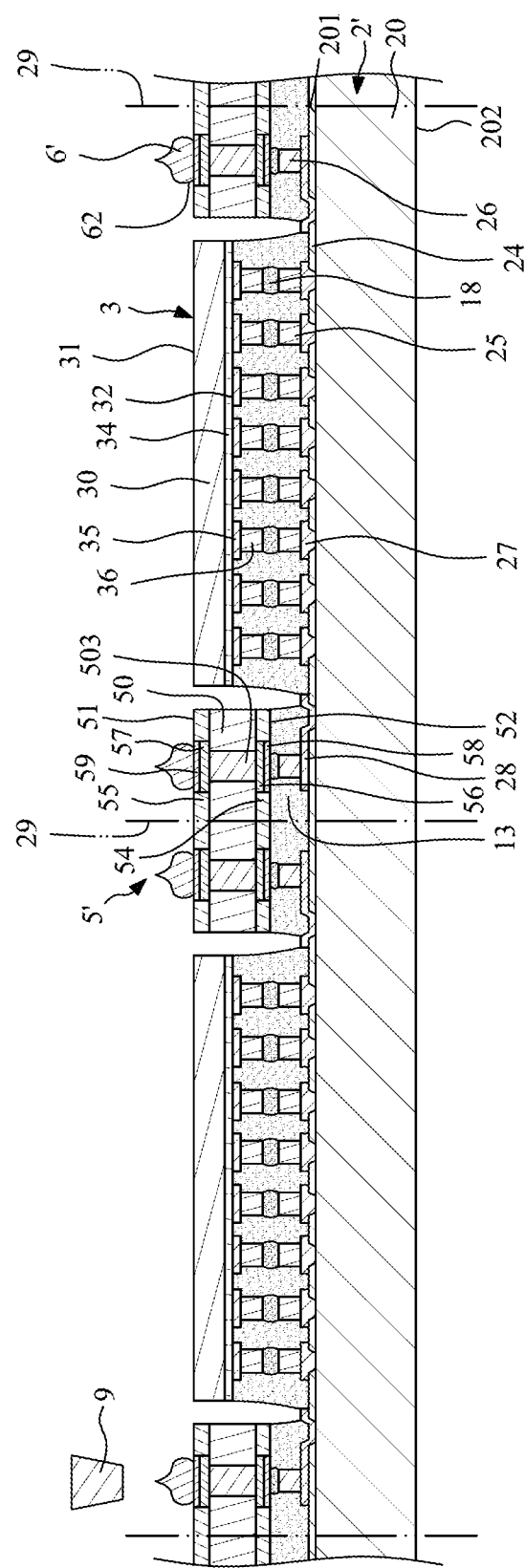
FIG. 13 illustrates one or more stages of an example of a method for manufacturing an optical structure according to some embodiments of the present disclosure.

Referring to FIG. 13, at least one stud bump 6' is formed or disposed on the top surface 51 of the interposer 5'. In some embodiments, the stud bump 6' may be formed or disposed on and electrically connected to the top surface 51 of the interposer 5'. For example, the stud bump 6' may be physically and electrically connected to the upper surface finish layer 59 on the pad of the upper conductive layer 57. The stud bump 6' may be formed by a wire bonding head 9. The interposer 5' and the stud bump 6' may form a conductive structure 7 (FIG. 16).

Figure 14:
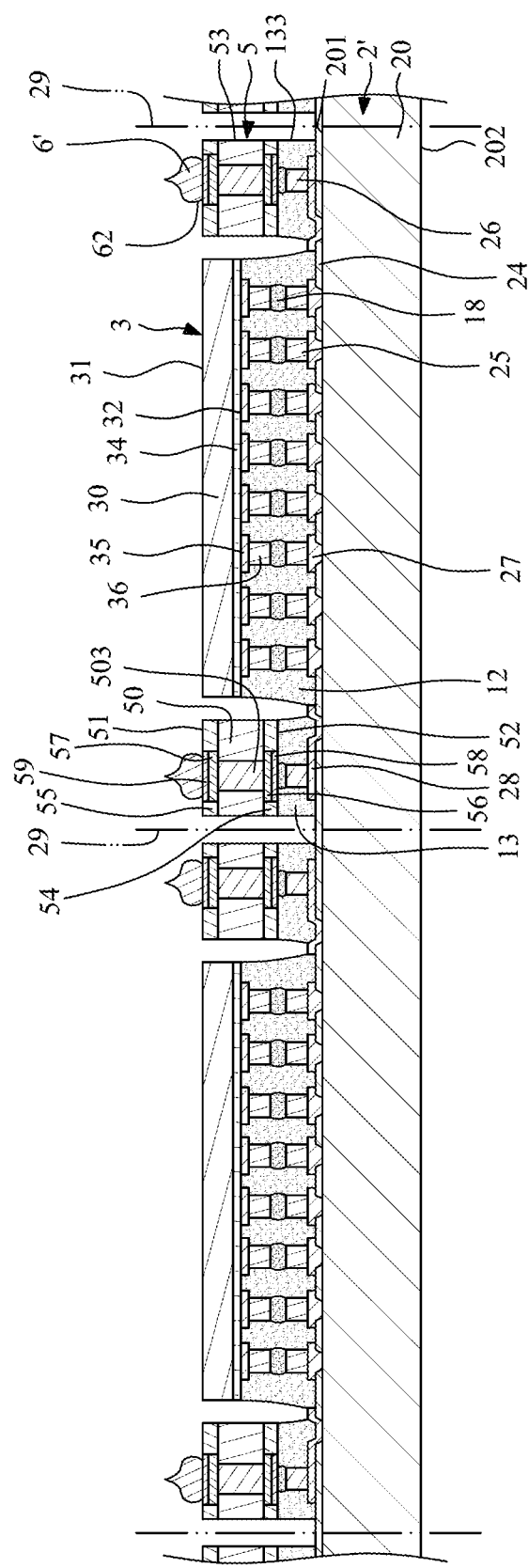
FIG. 14 illustrates one or more stages of an example of a method for manufacturing an optical structure according to some embodiments of the present disclosure.

Referring to FIG. 14, the interposer 5' and the second underfill 13 are singulated along the cutting lines 29. The interposer 5' may be singulated to form a plurality of interposers 5. In some embodiments, the substrate 2' is not singulated.

Figure 15:
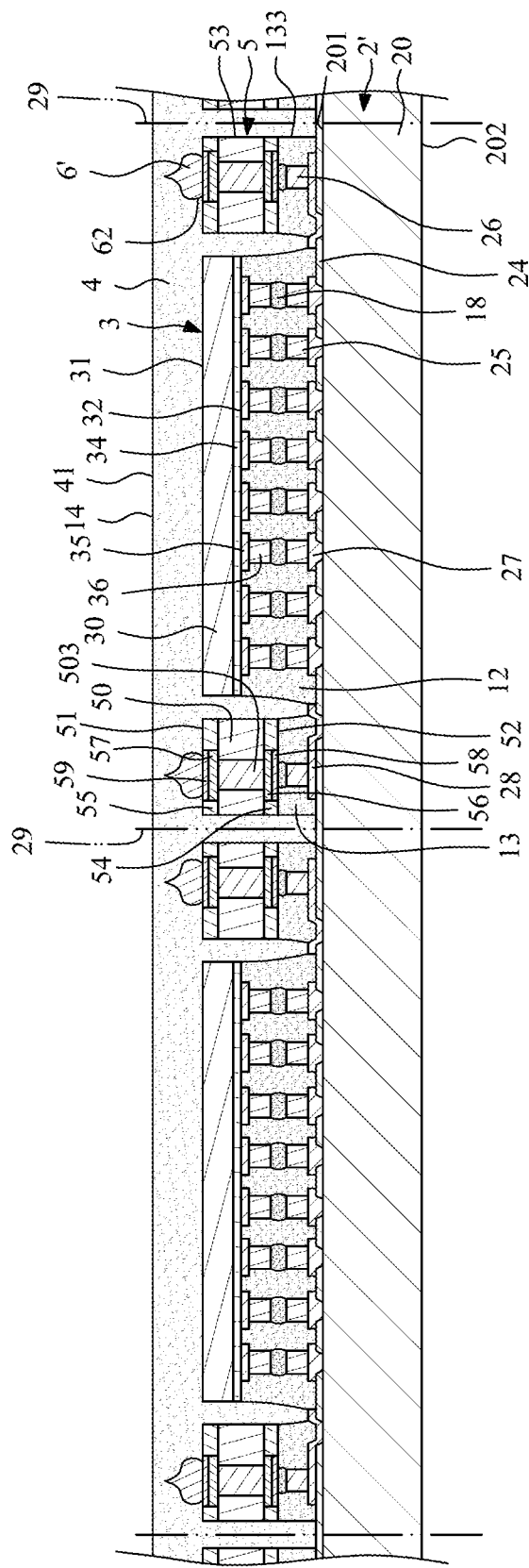
FIG. 15 illustrates one or more stages of an example of a method for manufacturing an optical structure according to some embodiments of the present disclosure.

Referring to FIG. 15, an encapsulant 4 is formed or disposed on the top surface 21 of the substrate 2' to cover or encapsulate the optical component 3, the first underfill 12, the conductive structure 7 (including the stud bump 6' and the interposer 5), the second underfill 13 and the top surface 21 of the substrate 2'. The encapsulant 4 may have a top surface 41.

Figure 16:
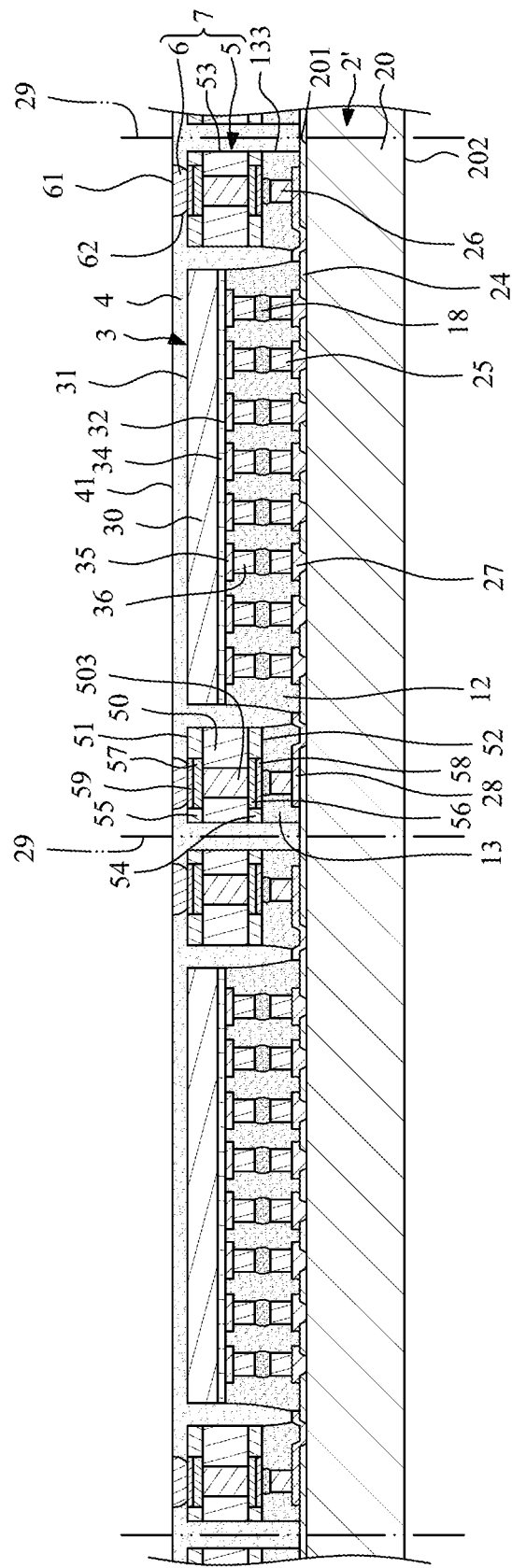
FIG. 16 illustrates one or more stages of an example of a method for manufacturing an optical structure according to some embodiments of the present disclosure.

Referring to FIG. 16, the encapsulant 4 and the stud bump 6' of the conductive structure 7 are thinned from the top surface 41 by grinding. Thus, the stud bump 6' becomes a bonding pad 6 having a truncated top surface 61. Thus, the top surface 41 of the encapsulant 4 may be substantially aligned or coplanar with the truncated top surface 61 of the bonding pad 6 since they are ground concurrently. The truncated top surface 61 of the bonding pad 6 may be exposed from the top surface 41 of the encapsulant 4. Meanwhile, the conductive structure 7 may include the bonding pad 6 and the interposer 5.

Figure 17:
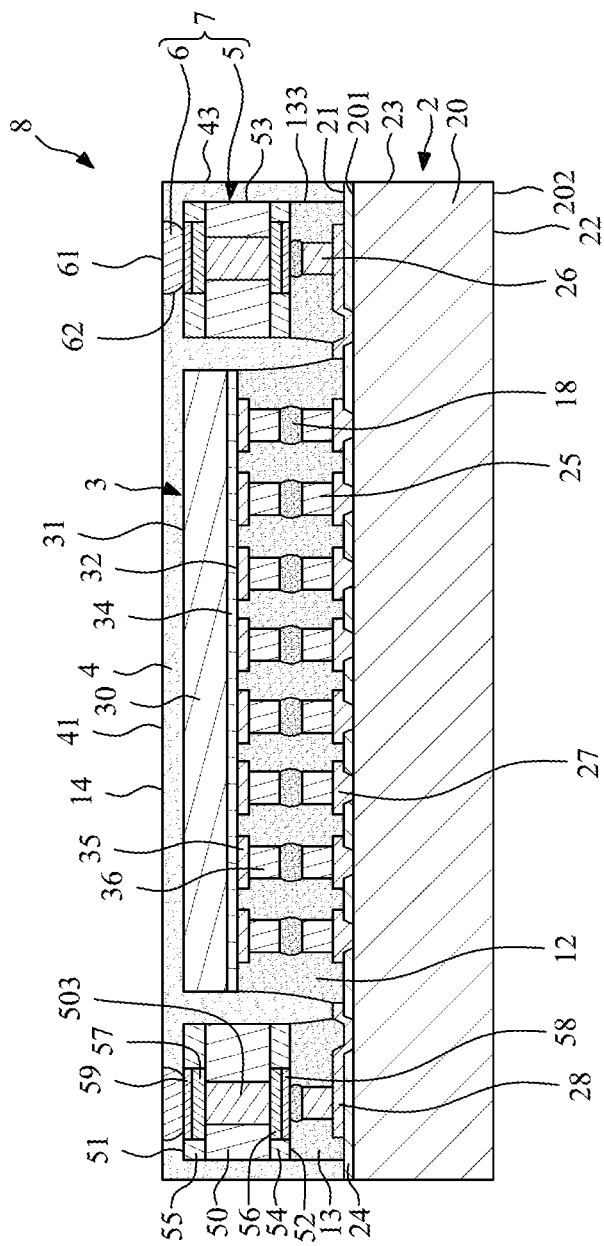
FIG. 17 illustrates one or more stages of an example of a method for manufacturing an optical structure according to some embodiments of the present disclosure.

Referring to FIG. 17, the encapsulant 4 and the substrate 2' are singulated along the cutting lines 29 as to obtain or form a plurality of package structures 8. The package structure 8 of FIG. 17 may be similar to or same as the package structure 8 of FIG. 1.

Figure 18:
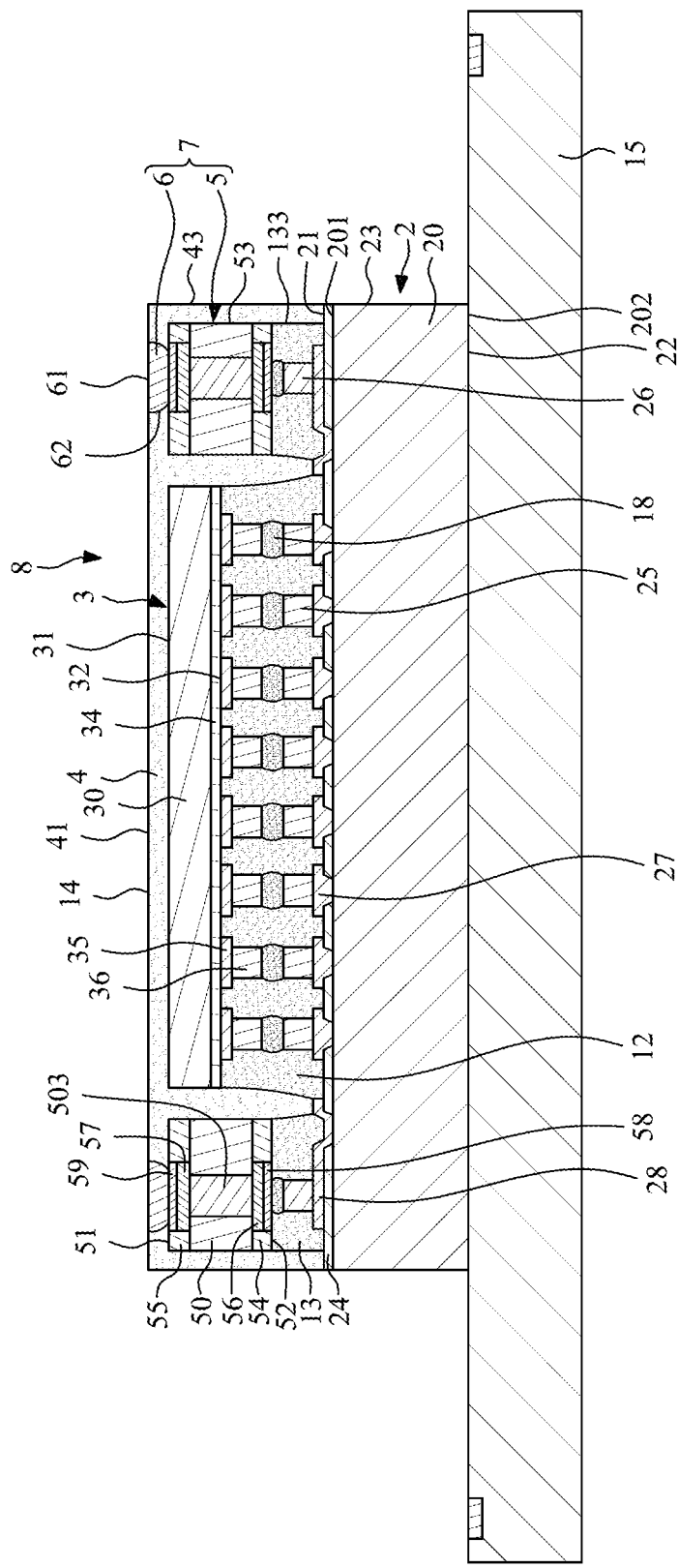
FIG. 18 illustrates one or more stages of an example of a method for manufacturing an optical structure according to some embodiments of the present disclosure.

Referring to FIG. 18, bottom surface 22 of the substrate 2 of the package structures 8 may be attached to a carrier 15. Then, a plurality of conductive wires 16 are provide to physically connects and electrically connects the truncated top surface 61 of the bonding pad 6 and the carrier 15. Thus, the optical structure 1 of FIG. 1 is formed.

Figure 19:
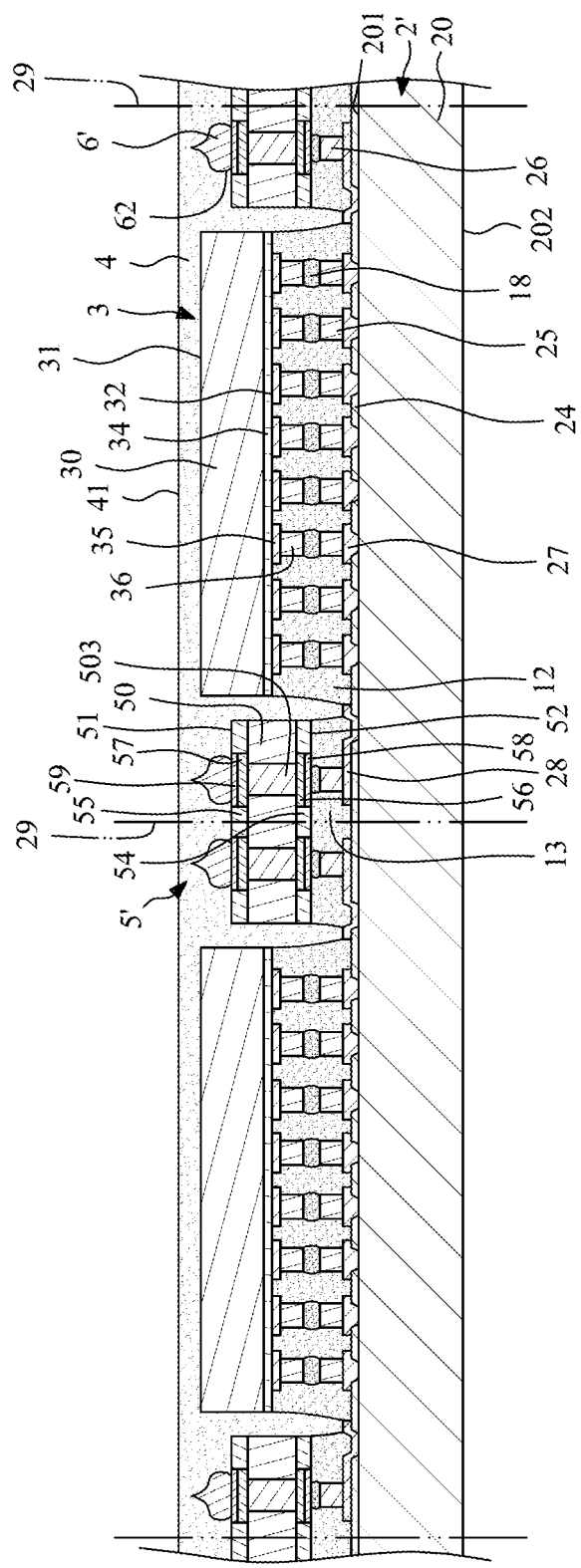
FIG. 19 illustrates one or more stages of an example of a method for manufacturing an optical structure according to some embodiments of the present disclosure.

FIG. 19 through FIG. 22 illustrate a method for manufacturing an optical structure according to some embodiments of the present disclosure. In some embodiments, the method is for manufacturing the optical structure 1a shown in FIG. 2. The initial stages of the illustrated process are the same as, or similar to, the stages illustrated in FIG. 6 to FIG. 13. FIG. 19 depicts a stage subsequent to that depicted in FIG. 13.

Referring to FIG. 19, an encapsulant 4 is formed or disposed on the top surface 21 of the substrate 2' to cover or encapsulate the optical component 3, the first underfill 12, the conductive structure 7 (including the stud bump 6' and the interposer 5'), the second underfill 13 and the top surface 21 of the substrate 2'. The encapsulant 4 may have a top surface 41.

Figure 20:
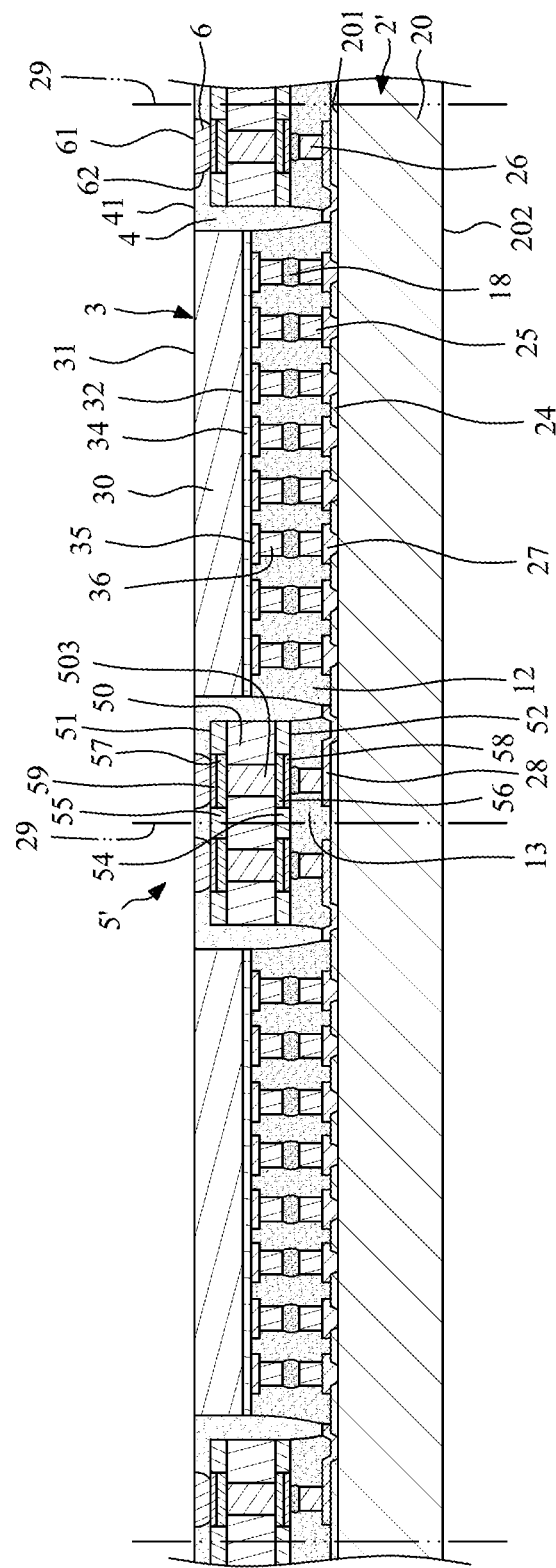
FIG. 20 illustrates one or more stages of an example of a method for manufacturing an optical structure according to some embodiments of the present disclosure.

Referring to FIG. 20, the encapsulant 4, the stud bump 6' of the conductive structure 7 and the optical component 3 are thinned from the top surface 41 by grinding. Thus, the stud bump 6' becomes a bonding pad 6 having a truncated top surface 61. Thus, the top surface 41 of the encapsulant 4 may be substantially aligned or coplanar with the truncated top surface 61 of the bonding pad 6 and the top surface 31 of the optical component 3 since they are ground concurrently.

Figure 21:
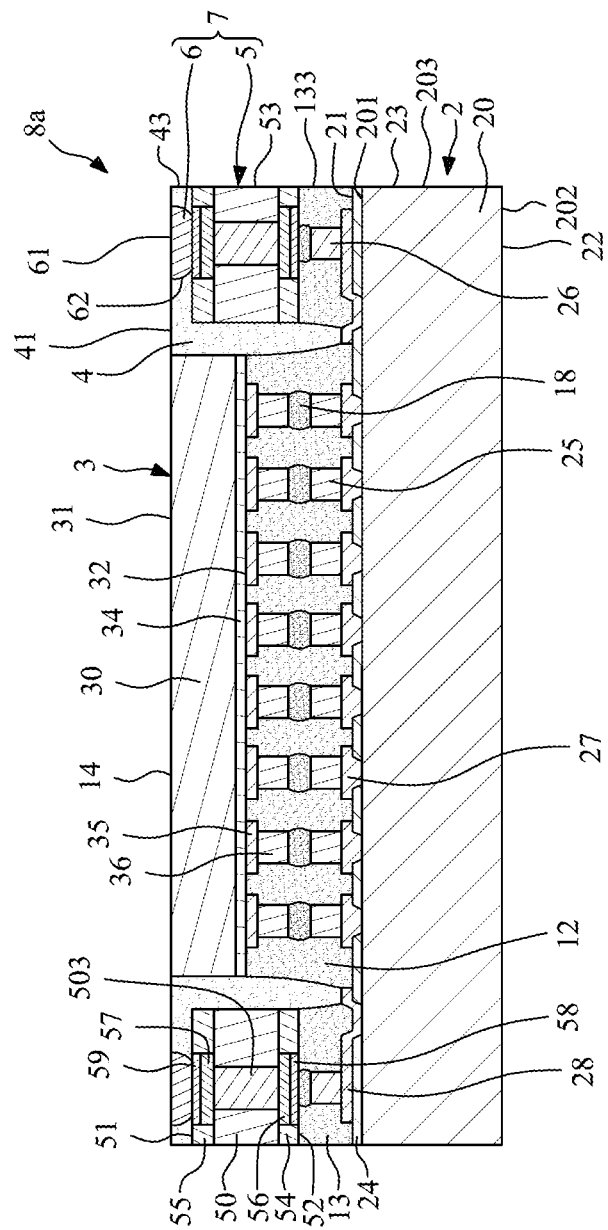
FIG. 21 illustrates one or more stages of an example of a method for manufacturing an optical structure according to some embodiments of the present disclosure.

Referring to FIG. 21, the encapsulant 4, the interposer 5', the second underfill 13 and the substrate 2' are singulated along the cutting lines 29 as to obtain or form a plurality of package structures 8a. The package structure 8a of FIG. 21 may be similar to or same as the package structure 8a of FIG. 2.

Figure 22:
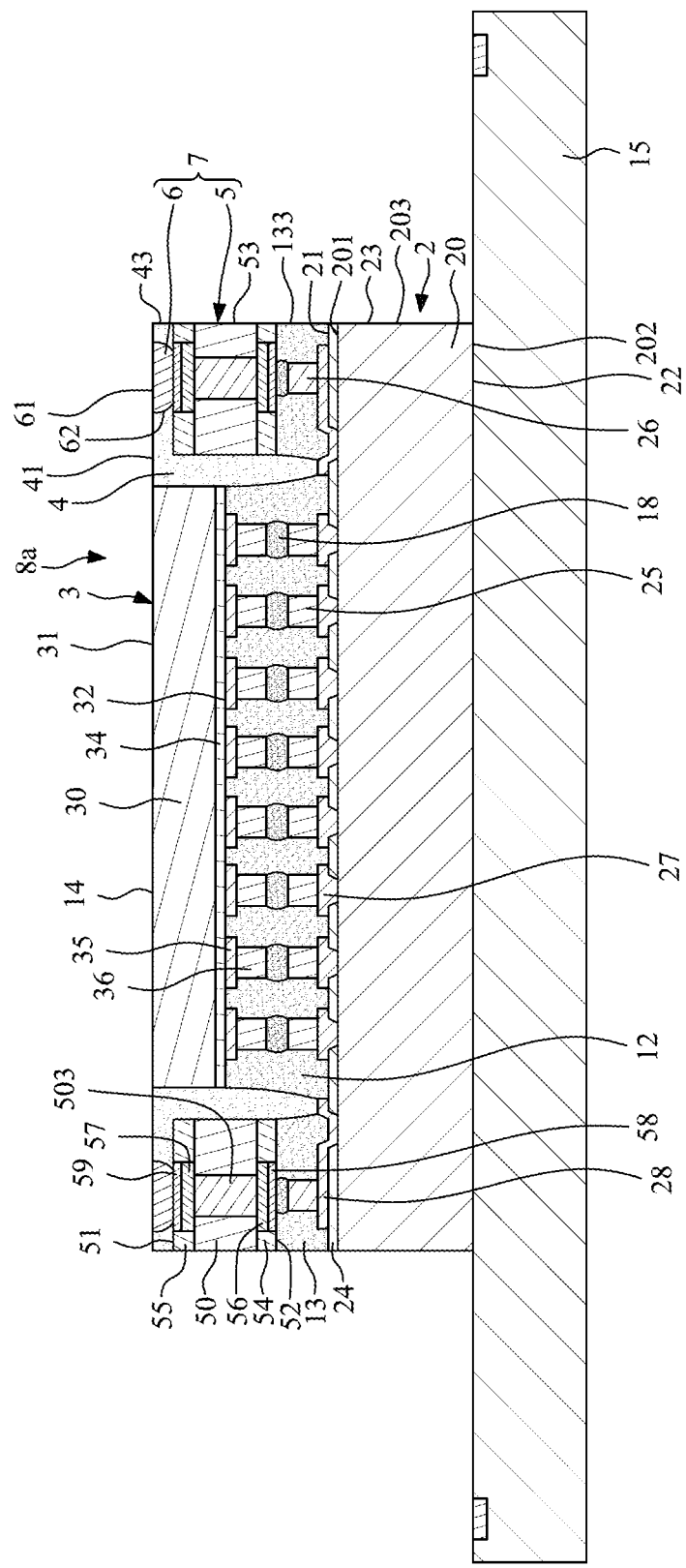
FIG. 22 illustrates one or more stages of an example of a method for manufacturing an optical structure according to some embodiments of the present disclosure.

Referring to FIG. 22, bottom surface 22 of the substrate 2 of the package structures 8a may be attached to a carrier 15. Then, a plurality of conductive wires 16 are provide to physically connects and electrically connects the truncated top surface 61 of the bonding pad 6 and the carrier 15. Thus, the optical structure 1a of FIG. 2 is formed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a first die having an active surface;
   a second die disposed on the first die and having an active surface and a backside surface opposite to the active surface, wherein the active surface of the second die is closer to the active surface of the first die than the backside surface of the second die is;
   an encapsulant encapsulating the first die and the second die, and having a top surface far away from the active surface of the first die; and
   at least one electrical contact exposed from the top surface of the encapsulant and configured for connecting at least one conductive wire.

2. An optical structure, comprising:
   a substrate;
   an optical component electrically connected to a top surface of the substrate;
   at least one conductive structure disposed around the optical component and electrically connected to the optical component through the substrate; and
   an encapsulant encapsulating the optical component, the at least one conductive structure and the top surface of the substrate, wherein the at least one conductive structure has at least one wire bonding contact exposed from the encapsulant.

3. The package structure of claim 1, further comprising a carrier disposed under a backside surface of the first die, wherein the conductive wire electrically connects the electrical contact and the carrier, and a portion of the conductive wire extends along a lateral side of the first die.

4. The package structure of claim 1, wherein an elevation of the active surface of the second die is lower than an elevation of the top surface of the encapsulant.

5. The package structure of claim 1, wherein the electrical contact is spaced apart from the second die and is electrically connected to the first die.

6. The package structure of claim 5, further comprising a redistribution layer disposed on the active surface of the first die and exposed from the second die, wherein the electrical contact is electrically connected to the first die through the redistribution layer.

7. The package structure of claim 1, wherein in a top view, the at least one electrical contact includes a plurality of electrical contacts around the second die.

8. The package structure of claim 7, further comprising a substrate disposed between the electrical contacts and the first die.

9. The optical structure of claim 2, wherein the optical component includes a sensor region, and the encapsulant covers the sensor region and includes a light transmitting material.

10. The optical structure of claim 2, wherein a lateral surface of the substrate is aligned with a lateral surface of the at least one conductive structure and a lateral surface of the encapsulant.

11. The optical structure of claim 2, wherein the encapsulant covers a lateral surface of the at least one conductive structure, and a lateral surface of the encapsulant is aligned with a lateral surface of the substrate.

12. The optical structure of claim 2, wherein the at least one wire bonding contact is substantially aligned with a top surface of the encapsulant.

13. The optical structure of claim 12, wherein the at least one wire bonding contact is a truncated surface.

14. The optical structure of claim 13, wherein the at least one conductive structure has a curved lateral surface connecting the truncated surface.

15. The optical structure of claim 2, wherein the at least one conductive structure further includes at least one bump disposed on at least one interposer, wherein a top surface of the at least one bump includes the at least one wire bonding contact.

16. The optical structure of claim 15, wherein the at least one interposer is electrically connected to the substrate through a plurality of pillars.

17. The optical structure of claim 16, further comprising an underfill disposed between the substrate and the at least one interposer, and encapsulating the pillars.

18. The optical structure of claim 2, further comprising a first underfill disposed between a first region of the substrate and the optical component, wherein a second region of the substrate is exposed by the first underfill.

19. The optical structure of claim 18, further comprising a second underfill covering a portion of the second region, wherein the second underfill is spaced apart from the first underfill.

20. The optical structure of claim 19, wherein the encapsulant is disposed between the first underfill and the second underfill, and covers another portion of the second region exposed by the second underfill.

* * * * *